(12) United States Patent
Cai

(10) Patent No.: US 9,196,314 B2
(45) Date of Patent: Nov. 24, 2015

(54) EXTENDED-HEIGHT DIMM

(75) Inventor: Victor Cai, Pasadena, CA (US)

(73) Assignee: Inphi Corporation, Westlake Village, CA (US)

( * ) Notice: Subject to any disclaimer, the term of this patent is extended or adjusted under 35 U.S.C. 154(b) by 791 days.

(21) Appl. No.: 13/530,647

(22) Filed: Jun. 22, 2012

(65) Prior Publication Data

US 2012/0331219 A1    Dec. 27, 2012

Related U.S. Application Data

(60) Provisional application No. 61/501,083, filed on Jun. 24, 2011.

(51) Int. Cl.
*G06F 1/16* (2006.01)
*G11C 5/04* (2006.01)

(52) U.S. Cl.
CPC .......................................... *G11C 5/04* (2013.01)

(58) Field of Classification Search
USPC ............. 365/230.01, 230.02, 189.02, 189.05, 365/163, 63, 51, 193, 227, 222, 226, 194, 365/185, 2, 185.03; 439/355, 65, 489, 633, 439/66, 328, 68; 345/537, 520, 545, 555, 345/212, 94, 204, 690, 589, 169, 210, 98, 345/422, 519, 506, 99, 100, 211; 361/721, 361/752, 748, 679.31, 679.02, 679.32, 361/679.33, 679.58, 679.47, 679.54, 361/679.48, 679.6, 679.17, 679.46, 679.37; 711/103, 106, 105, 170, 167, 154, 171, 711/148, 152, 130; 455/550.1, 575.1, 557
See application file for complete search history.

(56) References Cited

U.S. PATENT DOCUMENTS

| | | | |
|---|---|---|---|
| 2006/0203442 A1* | 9/2006 | Goodwin | 361/684 |
| 2012/0311249 A1* | 12/2012 | Koya | 711/105 |
| 2013/0042127 A1* | 2/2013 | Thomas et al. | 713/323 |

OTHER PUBLICATIONS

"JEDEC Document, M0-269H", Jun. 15, 2011, pp. 1-24.

* cited by examiner

*Primary Examiner* — Hung Duong
(74) *Attorney, Agent, or Firm* — Koppel, Patrick, Heybl & Philpott

(57) ABSTRACT

An extended-height DIMM for use in a memory system having slots designed to receive DIMMs that comply with a JEDEC standard that specifies a maximum height for the DIMM and a maximum number of devices allowed to reside on the DIMM. The DIMM comprises a PCB having an edge connector designed to mate with a memory system slot and a height which is greater than the maximum height specified in the applicable standard, a plurality of memory devices which exceeds the maximum number of devices specified in the applicable standard, and a memory buffer which operates as an interface between a host controller's data and command/address busses and the memory devices. This arrangement enables the extended-height DIMM to provide greater memory capacity than would a DIMM which complies with the maximum height and maximum number of devices limits.

11 Claims, 1 Drawing Sheet

EXTENDED-HEIGHT DIMM

RELATED APPLICATIONS

This application claims the benefit of provisional patent application number 61/501,083 to Victor Cai, filed Jun. 24, 2012.

BACKGROUND OF THE INVENTION

1. Field of the Invention

This invention relates generally to dual-inline memory modules (DIMMs), and more particularly to the physical characteristics of such DIMMs.

2. Description of the Related Art

Conventional computer memory systems provide random access memory by means of dual-inline memory modules (DIMMs), which are plugged into respective slots on the computer's motherboard. A number of individual RAM chips—typically dynamic RAM (DRAM)—reside on each DIMM.

The physical and electrical characteristics of a given DIMM module are governed by various industry standards documents, typically those promulgated by the Joint Electron Device Engineering Council (JEDEC). For example, a set of JEDEC standards governing the characteristics of a DDR3 SDRAM DIMM specifies that the DIMM module have a height that is no greater than approximately 30 mm; such a DIMM can accommodate up to two rows of DRAMs.

This height limitation imposes a limit on the DIMM's memory capacity. One way of overcoming this limitation is to use 'stacked' DRAM chips, each of which consists of two or more DRAM circuits within a single DRAM package, instead of conventional non-stacked (planar) DRAMs. However, stacked DRAMs tend to be both more expensive and less reliable than conventional DRAMs.

SUMMARY OF THE INVENTION

The present invention is directed to an 'extended-height' DIMM, which provides increased memory capacity when compared with a conventional DIMM.

The new extended-height DIMM is for use in a memory system having slots designed to receive DIMMs that comply with a JEDEC standard that specifies a maximum height for the DIMM and a maximum number of devices allowed to reside on the DIMM. The DIMM comprises:
  a printed circuit board (PCB) having an edge connector designed to mate with the memory system slots, the height of the PCB being greater than the maximum height specified in the applicable standard;
  a plurality of memory devices on the PCB (typically DRAMs) which exceeds the maximum number of devices specified in the applicable standard; and
  a memory buffer on the PCB arranged to operate as an interface between a host controller's data and command/ address busses and all of the DIMM's memory devices;
  such that the extended-height DIMM provides greater memory capacity than would a DIMM which complies with the maximum height and maximum number of devices limits The present extended-height DIMM can be used in at least two ways. Since it can accommodate a greater number of DRAMs, an extended-height DIMM can be populated with conventional non-stacked (planar) DRAMs and still provide a memory capacity that would otherwise require the use of stacked DRAMs on a standard DIMM. Alternatively, the extended-height DIMM could be populated with stacked DRAMs, providing even greater memory capacity.

These and other features, aspects, and advantages of the present invention will become better understood with reference to the following description and claims.

DETAILED DESCRIPTION OF THE INVENTION

Figure 1:
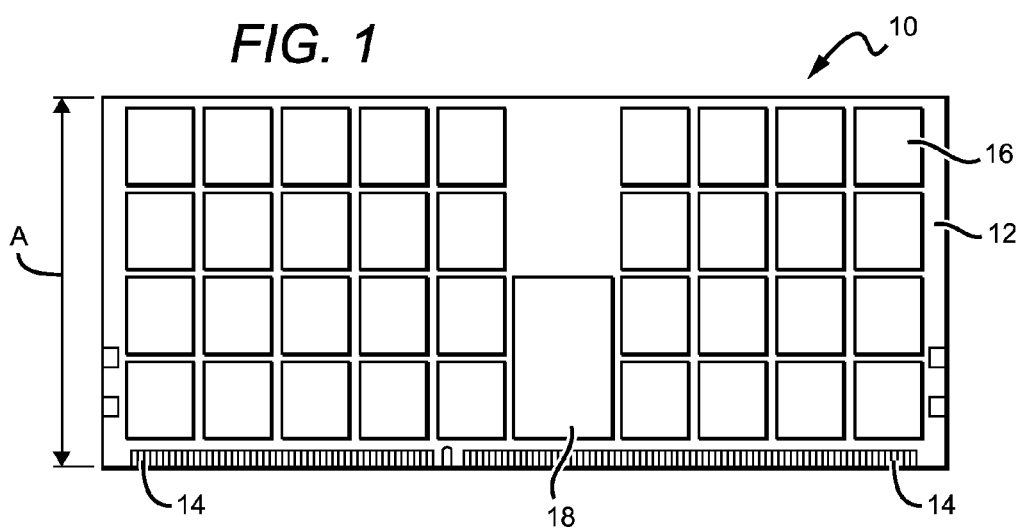
FIG. 1 is an illustration of an extended-height DIMM in accordance with the present invention.

The present extended-height DIMM is for use in a memory system having slots designed to receive DIMMs that comply with a JEDEC standard that specifies a maximum height for the DIMM and the maximum number of devices allowed to reside on the DIMM; an exemplary embodiment of such a DIMM is shown in FIG. 1. The DIMM 10 comprises a PCB 12 having an edge connector 14 designed to mate with a respective one of the memory system's slots (not shown).

The height 'A' of the PCB is greater than the maximum height imposed by the JEDEC specification governing that type of DIMM. For example, JEDEC document MO-269 (dated Jun. 15, 2011) specifies that the nominal height of a standard DDR3 SDRAM DIMM is to be approximately 30 mm The height of the present extended-height DIMM is greater than 30 mm, and is preferably 56 mm (though other heights might also be used).

A plurality of memory devices 16 reside on PCB 12, with the number of devices exceeding the maximum number of devices specified in the applicable governing standard. For example, the DDR3 SDRAM DIMM discussed above can accommodate two rows of memory devices (typically DRAM chips) on each side of the PCB, with each row holding a maximum of 9 devices, for a maximum of 36 devices. In contrast, the present extended-height DIMM is preferably arranged to accommodate more than two rows of devices— preferably four rows—on each side of the PCB. Assuming that the DRAMs are sized such that nine devices fit in each row, and there are four rows on each side, the extended-height DIMM can accommodate a maximum of 72 devices.

Figure 2:
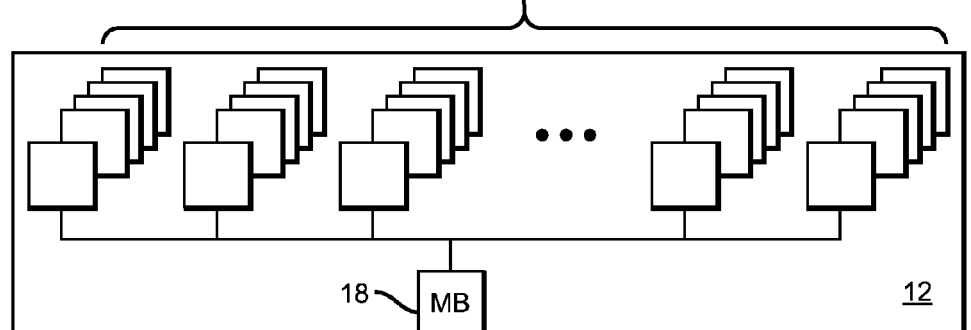
FIG. 2 is a block diagram of an extended-height DIMM in accordance with the present invention.

The present extended-height DIMM also includes a memory buffer (MB) 18 on PCB 12, which is used to buffer data bytes being written to or read from memory devices 16 by a host controller, as well as operate as a buffer between the host controller's command/address busses and memory devices 16. An exemplary block diagram of this arrangement is shown in FIG. 2, in which a data bus 20 (typically 72 bits wide) connects a host controller 22 to MB 18, which in turn interfaces with DRAM 16. The MB is preferably a single JEDEC-compatible MB such as the iMB (isolating Memory Buffer) from Inphi Corporation. Memory systems using a MB of this sort are described, for example, in co-pending U.S. patent application Ser. Nos. 12/267,355 and 12/563,308, which are incorporated herein by reference. When so arranged, the present extended-height DIMM provides greater memory capacity than would a DIMM which complies with the maximum height and number of devices limits referred to above.

The inclusion of a MB on the DIMM is essential to the successful operation of the present extended-height DIMM. If the extended-height DIMM lacked a MB, it would be practically impossible to provide the necessary signal routing to all of the DRAM chips on the DIMM. In addition, it is likely that the loading on the host controller presented by all of the DRAM chips would be prohibitively high. The interface and buffer functionality provided by the use of a MB makes the present extended-height DIMM possible, both in terms of signal routing to the DRAMs and load reduction for the host controller. A MB also enables more ranks to be supported than would otherwise be possible. For example, the memory buffer might be arranged to support up to 8 physical ranks, while appearing to a host controller as if there are no more than 4 logical ranks and 1 physical rank.

In view of the fact that the MB isolates the DRAMs from the host controller, DRAMs no longer need to be located in close proximity to a DIMM's connector edge to meet functional and performance requirements. Without these location restrictions, the size of the DIMM module can be opened to new, larger sizes, which in turn enables more DRAMs to be located on the DIMM. If non-stacked (planar) DRAM chips are used to populate such a DIMM, the memory capacity provided by an extended-height DIMM can be the equivalent of that provided by a standard height DIMM using stacked DRAMs, but at a much cheaper cost. Alternatively, the extended height DIMM can be populated with stacked DRAMs, thereby increasing the memory capacity in comparison with that which can be provided by a standard height DIMM. In either case, the host interface can remain the same as it would with a conventional DIMM, thereby enabling existing systems to take advantage of the extended-height DIMM.

The number of DRAM devices connected to the MB is only limited by the size of the PCB. For example, the current 30×133 mm DDR3 form factor allows 36 locations for DRAM devices. By increasing this to, for example, 56×133 mm, a DIMM can accommodate 72 DRAM devices. The height is only limited by the end application.

Figure 3:
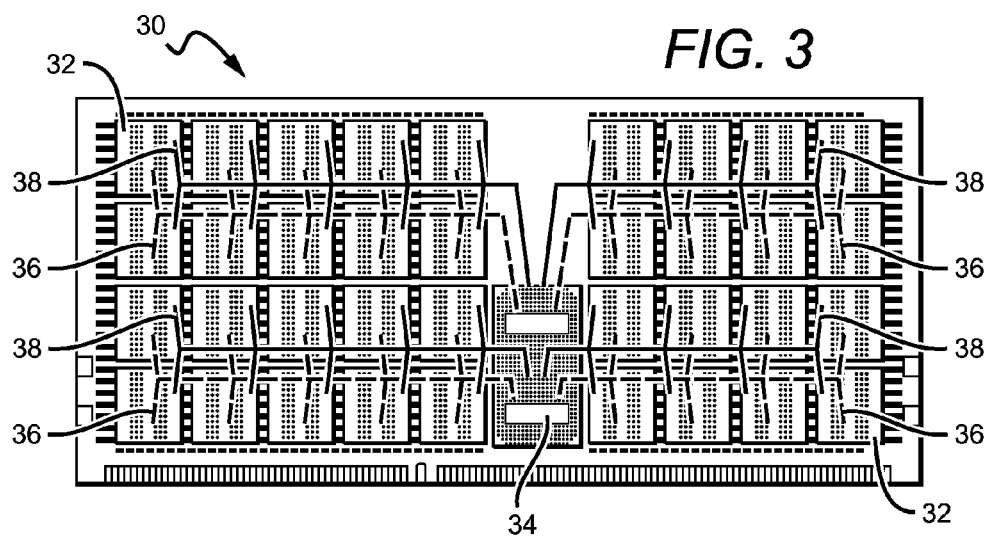
FIG. 3 is an illustration of an extended-height DIMM in accordance with the present invention, which indicates the flow of commands and data between a memory buffer and the DIMM's DRAM chips.

FIG. 3 is an illustration of a DIMM 30 in accordance with the present invention. This exemplary implementation includes four rows of DRAM chips 32, each of which includes nine chips. The flow of commands and data between a memory buffer 34 and the DRAM is indicated with lines 36, and the flow of data between memory buffer 34 and the DRAM chips is indicated with lines 38.

An extended-height DIMM as described herein can be used in at least two ways. Since it can accommodate a greater number of DRAMs, an extended-height DIMM can be populated with conventional non-stacked (planar) DRAMs and still provide a memory capacity that would otherwise require the use of stacked DRAMs on a standard DIMM, but at a much lower cost. Alternatively, the extended-height DIMM could be populated with stacked DRAMs, providing even greater memory capacity in comparison with that which can be provided by a standard height DIMM. Most current servers employ a 2U or 4U form factor, and can thus accommodate an extended-height DIMM as described herein.

One possible application of the present extended-height DIMM is for DDR3 DIMMs, though the present DIMM might also be used with DRAMs that comply with other standards, including DDR3L and DDR3U RDIMM, UDIMM or LRDIMM JEDEC standards.

The present extended-height DIMM can be populated with either four data lane (x4) or eight data lane (x8) DRAM chips. If x8 DRAM chips are used, nine chips would be required to interface with a typical 72 bit data bus (typically 64 bits of data and 8 ECC bits). Four rows of nine chips could reside on each side of a 56 mm high extended-height DIMM, and thereby provide up to eight ranks. If x4 DRAM chips are used, eighteen chips would be needed to interface with a 72 data bit bus. If each row contains nine chips, two rows would be needed, and the DIMM could include up to four ranks. The two rows of nine chips forming a given rank might be arranged to be adjacent to each other on the same side of the DIMM, or not adjacent to each other on the same side of the DIMM, or on opposite sides of the DIMM. Eight data lane (x8) DRAMs might be preferred as they are more common and thus less expensive than an equivalent four data lane DRAM. However, x4 DRAMs might be preferred since, as twice as many x4 chips are needed to provide the necessary 72 bits in comparison with x8 chips, an extended-height DIMM using x4 DRAMs could potentially provide twice the amount of storage capacity as an extended-height DIMM using x8 DRAMs.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

I claim:

1. An extended-height DIMM for use in a memory system having slots designed to receive DIMMs that comply with a JEDEC standard that specifies a maximum height for the DIMM and the maximum number of devices allowed to reside on the DIMM, comprising:
   a printed circuit board (PCB) having an edge connector designed to mate with a respective one of said memory system slots, the height of said PCB being greater than said maximum height;
   a plurality of memory devices on said PCB which exceeds said maximum number of devices; and
   a memory buffer on said PCB arranged to operate as an interface between a host controller's data and command/address busses and all of said memory devices;
   such that said extended-height DIMM provides greater memory capacity than would a DIMM which complies with said maximum height and maximum number of devices limits.

2. The extended-height DIMM of claim 1, wherein said maximum height is approximately 30 mm and said PCB has a height of approximately 56 mm.

3. The extended-height DIMM of claim 1, wherein said maximum number of devices limit is 36 and said PCB can accommodate as many as 72 devices.

4. The extended-height DIMM of claim 1, wherein said memory devices are planar DRAMs.

5. The extended-height DIMM of claim 4, wherein the greater number of planar DRAMs accommodated by said extended-height DIMM enable said extended DIMM to provide a memory capacity comparable to that of a DIMM on which stacked DRAMs reside and which is in compliance with said standard.

6. The extended-height DIMM of claim 1, wherein said memory devices are stacked DRAMs.

7. The extended-height DIMM of claim 1, wherein said memory buffer is arranged to support up to 8 physical ranks while appearing to said host controller as if there are no more than 4 logical ranks and 1 physical rank.

8. The extended-height DIMM of claim 1, wherein said slots are designed to receive DIMMs in compliance with the DDR3, DDR3L and DDR3U RDIMM, UDIMM or LRDIMM JEDEC standards.

9. The extended-height DIMM of claim 1, wherein said memory devices are eight data lane devices.

10. The extended-height DIMM of claim 1, wherein said memory devices are four data lane devices.

11. The extended-height DIMM of claim 1, wherein said memory buffer is a JEDEC-compatible memory buffer.

* * * * *